(12) United States Patent
Roger

(10) Patent No.: US 8,010,075 B1
(45) Date of Patent: Aug. 30, 2011

(54) HIGH ORDER HARMONICS GENERATOR

(75) Inventor: Frederic Roger, Munich (DE)

(73) Assignee: Scintera Networks, Inc., Sunnyvale, CA (US)

(*) Notice: Subject to any disclaimer, the term of this patent is extended or adjusted under 35 U.S.C. 154(b) by 777 days.

(21) Appl. No.: 12/037,455

(22) Filed: Feb. 26, 2008

(51) Int. Cl.
*H04B 1/26* (2006.01)

(52) U.S. Cl. ........ 455/318; 455/307; 455/259; 327/120; 331/76

(58) Field of Classification Search .......... 455/314–333, 455/296, 307, 114.2, 255–265; 331/183, 331/76; 327/119–123
See application file for complete search history.

(56) References Cited

U.S. PATENT DOCUMENTS

| 3,706,048 | A | * | 12/1972 | Johnston | 331/53 |
| 4,398,153 | A | * | 8/1983 | Rittenbach | 327/119 |
| 4,959,557 | A | * | 9/1990 | Miller | 327/175 |
| 5,059,927 | A | * | 10/1991 | Cohen | 331/77 |
| 5,978,662 | A | * | 11/1999 | Swales | 455/126 |
| 7,119,588 | B2 | * | 10/2006 | Kelley | 327/116 |

* cited by examiner

*Primary Examiner* — Edward Urban
*Assistant Examiner* — RuiMeng Hu
(74) *Attorney, Agent, or Firm* — Haynes and Boone, LLP

(57) ABSTRACT

A high-order harmonics generator includes a plurality of high-pass filters to block out DC signals. In one embodiment, high-pass filters are coupled to the output signals from an envelope detector and a power detector. A high-pass filter can also be coupled to the output of a multiplier that multiplies the filtered envelope signal and the filtered power signal. Additional multipliers may also be used at outputs of multipliers in a cascaded chain of multipliers for higher harmonics generation.

7 Claims, 1 Drawing Sheet

HIGH ORDER HARMONICS GENERATOR

BACKGROUND

1. Field of Invention

The present invention relates to harmonic generators, and more particular to higher order harmonic generators.

2. Related Art

In conventional harmonic generators, harmonics are produced by passing a sinusoidal signal through one or more non-linear devices, such as analog multipliers, to generate a series of harmonics of the input signal. The desired harmonic can then be isolated through filtering and amplification. When operated near the saturation level of the devices, high non-linearities can occur. Thus, one solution is to reduce the power of the signal (sometimes referred to as "back-off") to operate the devices in a more linear region. However, this then requires circuits that are bigger and more expensive than what would normally be needed. Furthermore, using low power or voltage signals would require large gains to obtain desired high power outputs. The large gains would also be applied to offsets, resulting in large unwanted offsets, which in turn will generate more non-linearities.

One type of high-frequency harmonic generator, such as a microwave generator, use low-order multipliers cascaded and combined to produce the desired frequency. However, generating harmonics using a series of analog multipliers has its disadvantages. First, a DC offset voltage or signal is generated along with the harmonics at different frequency components. The DC signal has negative effects, such as degrading the performance and/or linearity of the next multipliers in the cascade, reducing the dynamic range of the desired signal by the amount of undesired DC voltage, and creating undesired cross products that might be larger than the desired harmonics. In addition, higher order harmonics cannot be properly generated using current harmonics generators.

Therefore, there is a need for a harmonics generator that overcomes the disadvantages discussed above with conventional generators.

SUMMARY

According to one aspect of the present invention, a high-order harmonics generator includes a plurality of high-pass filters to block out DC signals. In one embodiment, high-pass filters are coupled to the output signals from an envelope detector and a power detector. A high-pass filter can also be coupled to the output of a multiplier that multiplies the filtered envelope signal and the filtered power signal. Additional multipliers may also be used at outputs of multipliers in a cascaded chain of multipliers for harmonics generation.

Because DC components or signals at 0 Hz are not longer present, the adverse effects of DC signals are also no longer present. For example, negative effects such as degrading the performance and/or linearity of the next multipliers in the cascade, reducing the dynamic range of the desired signal by the amount of undesired DC voltage, and creating undesired cross products that are larger than the desired harmonics are eliminated. Furthermore, offsets due to analog impairments are suppressed at no extra cost.

Embodiments of the present invention and their advantages are best understood by referring to the detailed description that follows.

BRIEF DESCRIPTION OF THE DRAWING

It should be appreciated that like reference numerals are used to identify like elements illustrated in one or more of the figures.

DETAILED DESCRIPTION

Figure 1:
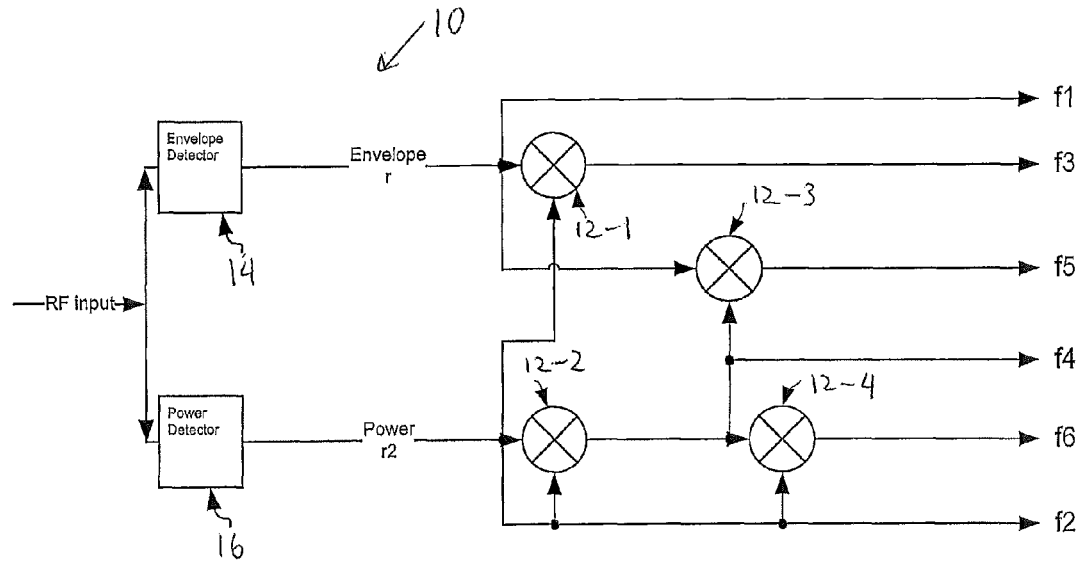
FIG. 1 shows one type of conventional harmonics generator.

FIG. 1 shows a conventional harmonics generator 10 using a series of analog multipliers 12. Harmonics generator 10 includes an envelope detector 14 and a power detector 16, each receiving the same RF input signal. The output of envelope detector 14 is a signal with a DC component and a component at frequency $\omega$, i.e., $$f_1 = a + A\cos(\omega) \quad (1)$$

The output of power detector 16 is a signal with a DC component and a component at frequency $2\omega$, i.e., $$f_2 = b + B\cos(2\omega) \quad (2)$$

Signal $f_1$ is multiplied with signal $f_2$ by an analog multiplier 12-1 to generate a signal having a harmonic at $3\omega$, i.e., $$f_3 = f_1 * f_2 = ab + \frac{2Ab + AB}{2}\cos(\omega) + aB\cos(2\omega) + \frac{AB}{2}\cos(3\omega) \quad (3)$$

Analog multiplier 12-2 generates the product of $f_2$ and $f_2$ to create a signal having a harmonic at $4\omega$, i.e., $$f_4 = f_2 * f_2 = \frac{2b^2 + B^2}{2} + 2bB\cos(2\omega) + \frac{B^2}{2}\cos(4\omega) \quad (4)$$

Third analog multiplier 12-3 multiplies signals $f_1$ and $f_4$ to generate a signal having a harmonic at $5\omega$, i.e., $$f_5 = f_1 * f_4 = \quad (5)$$
$$\frac{4ab^2 + 2aB^2}{4} + \frac{(4Ab^2 + 4AbB + 2AB^2)}{4}\cos(\omega) + 2abB\cos(2\omega) + $$
$$\frac{4bAB + AB^2}{4}\cos(3\omega) + \frac{aB^2}{2}\cos(4\omega) + \frac{AB^2}{4}\cos(5\omega)$$

Finally, a signal having a harmonic at $6\omega$ is generated from the output of multiplier 12-4 multiplying signals $f_2$ and $f_4$, i.e., $$f_6 = f_2 * f_4 = f_2 * f_2 * f_2 = \frac{4b^3 + 6bB^2}{4} + \quad (6)$$
$$\frac{12b^2B + 3B^3}{4}\cos(2\omega) + \frac{3bB^2}{2}\cos(4\omega) + \frac{B^3}{4}\cos(6\omega)$$

Thus, as seen from equations (1) to (6) above, each has a DC or 0 Hz component and each DC component has different amplitudes. Additional undesired cross products are created at other frequencies. The terms $f_1$ to $f_6$ represent the generated higher order harmonics of the input signal.

Figure 2:
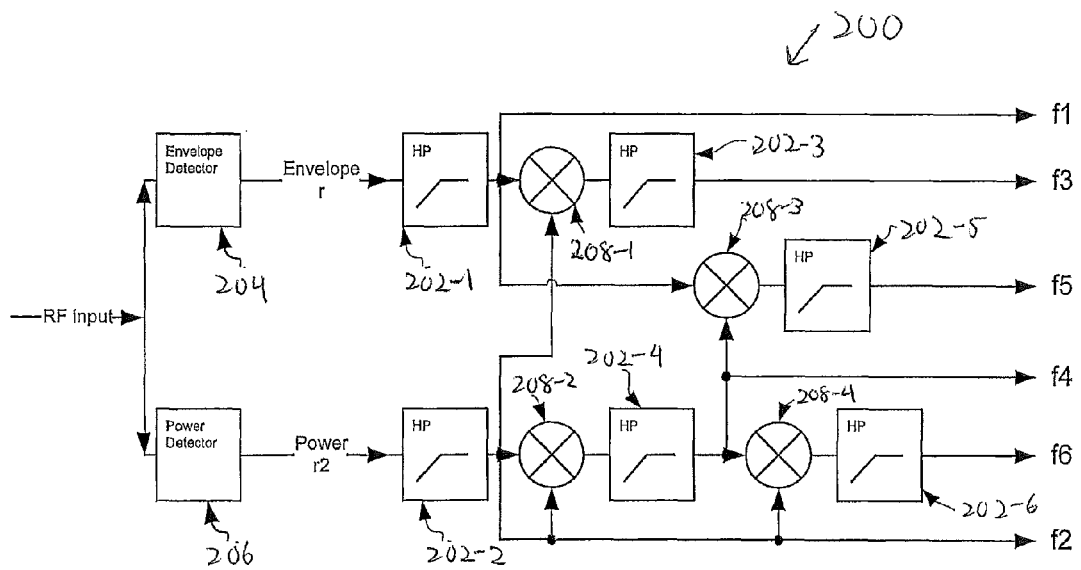
FIG. 2 shows a harmonics generator according to one embodiment of the present invention.

FIG. 2 shows a harmonics generator 200 in accordance with one embodiment of the present invention. Harmonics generator 200 includes a plurality of high-pass filters 202 to filter out or remove the DC signals. An envelope detector 204 and a power detector 206 each receive the same input RF signal. Envelope detector 204 generates a voltage representative of the instantaneous envelope power level of the input signal in the form of a DC component and a sinusoid. Envelope detectors provide an output which is the "envelope" of the original input signal. Power detector 206 generates the power of the original signal, also comprising a DC component and a sinusoid. Both envelope detector 204 and power detector 206 can be any suitable conventional detectors and are known to those skilled in the art. Thus, no further detail is provided.

The output signal of envelope detector 204 and the output signal of power detector 206 are input to a high-pass filter 202-1 and a high-pass filter 202-2, respectively. The high-pass filters disclosed herein pass high frequencies and attenuate or block very low frequencies, e.g., 100 kHz and lower, and DC components. In one embodiment, the high pass-filters have a cut-off frequency of 100 kHz. The high-pass-filters disclosed herein can be any suitable type of high-pass filter, which would be known to those skilled in the art. In one embodiment, the high-pass filters comprise a capacitor and a resistor. In such an arrangement, after the capacitor AC couples the input signals, a common mode is injected to define the bias point of a following multiplier. Injecting a common mode requires a resistor or equivalent that will have finite impedance. This finite impedance together with the capacitor creates a high pass filter. Consequently, after the signals from envelope detector 204 and power detector 206 propagate through high pass filters 202-1 and 202-2, the DC component has been removed. Thus, signal $f_1$ out of high-pass filter 202-1 is given as $$f_1 = A \cos(\omega) \qquad (7)$$

and signal $f_2$ out of, high-pass filter 202-2 is given as $$f_2 = B \cos(2\omega) \qquad (8)$$

Signals $f_1$ and $f_2$ are then input to a first multiplier 208-1, which produces the product signal as follows:

$$f_1 * f_2 = K1 + \frac{AB}{2}[\cos(\omega) + \cos(3\omega)] \qquad (9)$$

where K1 is a DC signal resulting from offsets from first multiplier 208-1. A high-pass filter 208-3 coupled to the output terminal of first multiplier 208-1 filters out DC signal K1 to output signal $f_3$ as follows:

$$f_3 = \frac{AB}{2}[\cos(\omega) + \cos(3\omega)] \qquad (10)$$

A second multiplier 208-2 receives signal $f_2$ and multiplies signal $f_2$ with itself to generate the product signal $f_4$ as follows:

$$f_2 * f_2 = K2 + \frac{B^2}{2}[1 + \cos(4\omega)] \qquad (11)$$

where K2 is a DC signal resulting from offsets of second multiplier 208-2. This signal is then passed through a high pass filter 202-4, which blocks the DC components K2 and $B^2/2$, resulting in signal $f_4$ as follows:

$$f_4 = f_2 * f_2 = \frac{B^2}{2}\cos(4\omega) \qquad (12)$$

A third multiplier 208-3 multiplies signal $f_1$ with signal $f_4$ to generate the product signal as follows:

$$f_1 * f_4 = K3 + \frac{AB^2}{4}[\cos(3\omega) + \cos(5\omega)] \qquad (13)$$

where K3 is a DC signal resulting from offsets of third multiplier 208-3. This output signal from multiplier 208-3 is provided as an input to a high-pass filter 202-5, which filters out the DC component K3. The resulting signal $f_5$ is given as follows:

$$f_5 = \frac{AB^2}{4}[\cos(3\omega) + \cos(5\omega)] \qquad (14)$$

A fourth multiplier 208-4 multiplies signal $f_2$ with signal $f_4$ to generate the following product signal:

$$f_2 * f_4 = K4 + \frac{B^3}{4}[\cos(2\omega) + \cos(6\omega)] \qquad (15)$$

where K4 is a DC signal resulting from offsets of fourth multiplier 208-4. A high-pass filter 202-6 receives this product signal and blocks out the DC component to yield signal $f_6$ as follows:

$$f_6 = \frac{B^3}{4}[\cos(2\omega) + \cos(6\omega)] \qquad (16)$$

As a result of the high-pass filters, signals $f_1$ to $f_6$ do not have any DC components, either as a result of cross products or multiplier offsets. Thus, harmonics generator 200 receives an input signal at a fundamental frequency $\omega$, such as from a signal generator (not shown), and converts it to output signals with harmonics of the fundamental frequency $\omega$, but without any DC components or signals below the cut off frequency of the high pass filters. For example, the fundamental frequency can be a microwave frequency for harmonic generation of high-order harmonics, e.g., $5^{th}$ order and greater. A desired harmonic, e.g., the $6^{th}$ harmonic, can then be selected. For example, a narrow pass-band filter can be used to pass only the desired harmonic to produce the desired output signal.

Because the high-pass filter blocks any DC components, negative effects resulting from the DC signal are no longer present. For example, there is no degradation of the performance or linearity of subsequent multipliers in the circuit caused by the DC signal, there is no reduction of the dynamic range of the desired signal by the DC signal, and there is no generation of undesired cross-products that are larger than the desired harmonics. Thus, crosstalk and offsets are greatly reduced and dynamic range can be reduced by at least two orders of magnitude. Dynamic range reduction may also be desirable in digital implementations to reduce the number of bits needed for the processing. The high-pass filters can also advantageously filter out flicker noise related to direct current, which results from a variety of effects, such as impurities in a conductive channel and generation and recombination noise in a transistor due to base current.

One use of the harmonics generator disclosed herein is in predistortion applications, such as to linearize power amplifiers. Typically, a predistortion unit is placed between the input signal and the power amplifier, where the predistortion unit receives signals for distorting the input signal based on feedback signals from the amplifier output. Thus, before the signal is amplified, an estimate is made of the manner in which the amplifier will inherently distort the particular input signal by amplifying that signal. The signal to be amplified is then "predistorted" by applying to it a transformation which is estimated to be complementary to the distorting transformation which the amplifier itself will apply as it amplifies the signal. Ideally, the predistorting transformation is cancelled out by the amplifier's distorting transformation, resulting in an undistorted, amplified output signal. Although using high-pass filters removes information, i.e., frequencies below the cut off frequency of the filters, system simulations have shown no significant negative impact on the predistortion.

Although the invention has been shown and clearly depicted, various other changes, additions and omissions in the form and detail thereof may be made therein without departing from the intent and scope of this invention. For example, additional multipliers can be used in a longer cascade chain to generate higher order harmonics, and high-pass filters do not need to be at the output of each and every multiplier. Thus the invention is limited only by the following claims.

What is claimed is:

1. A harmonics generator, comprising:
   a power detector configured to receive an RF input signal and output a power signal;
   an envelope detector configured to receive the RF input signal and output an envelope signal;
   a first high-pass filter configured to receive the envelope signal and output a first signal;
   a second high-pass filter configured to receive the power signal and output a second signal;
   a first multiplier configured to multiply the first signal with the second signal and output a first product signal;
   a second multiplier configured to multiply the second signal with the second signal and output a second product signal;
   a third high-pass filter configured to receive the first product signal and output a third signal;
   a fourth high-pass filter configured to receive the second product signal and output a fourth signal;
   a third multiplier configured to multiply the first signal with the fourth signal and output a third product signal;
   a fourth multiplier configured to multiply the second signal with the fourth signal and output a fourth product signal;
   a fifth high-pass filter configured to receive the third product signal and output a fifth signal; and
   a sixth high-pass filter configured to receive the fourth product signal and output a sixth signal.

2. The harmonies generator of claim 1, wherein the first, second, third, fourth, fifth, and sixth signals are used in a predistortion application.

3. The harmonics generator of claim 1, wherein the first, second, third, fourth, fifth, and sixth high-pass filters have the same cut-off frequency.

4. A method of generating harmonics from an input RF signal, the method comprising:
   detecting envelope information from the RF signal;
   detecting power information from the RF signal;
   filtering out DC components from envelope and power information to generate a first signal and a second signal;
   multiplying the first signal with the second signal to generate a first product signal;
   multiplying the second signal with itself to generate a second product signal;
   filtering out DC components from the first product signal to generate a third signal;
   filtering out DC components from the second product signal to generate a fourth signal;
   multiplying the first signal with the fourth signal to generate a third product signal;
   multiplying the second signal with the fourth signal to generate a fourth product signal;
   filtering out DC components from the third product signal to generate a fifth signal: and
   filtering out DC components from the fourth product signal to generate a sixth signal.

5. The method of claim 4, wherein the filtering also filters out low frequency components.

6. The method of claim 4, wherein the first and second signals are used by predistortion applications.

7. The method of claim 4, wherein the first and second signals are harmonics of the RF input signal.

* * * * *